United States Patent [19]

Tsunoda

[11] Patent Number: 5,774,187
[45] Date of Patent: Jun. 30, 1998

[54] AUDIO/VISUAL APPARATUS FOR CONTROLLING CONTROL PARAMETERS

[75] Inventor: Yukio Tsunoda, Nagaokakyo, Japan

[73] Assignee: Mitsubishi Denki Kabushiki Kaisha, Tokyo, Japan

[21] Appl. No.: 907,911

[22] Filed: Aug. 11, 1997

Related U.S. Application Data

[63] Continuation of Ser. No. 518,568, Aug. 23, 1995, abandoned, which is a continuation of Ser. No. 243,770, May 17, 1994, abandoned.

[30] Foreign Application Priority Data

May 20, 1993 [JP] Japan .................................. 5-118468

[51] Int. Cl.⁶ .............................. H04N 5/445; H04N 5/57
[52] U.S. Cl. .......................... 348/553; 348/734; 348/569; 348/678
[58] Field of Search .................................. 348/569, 553, 348/734, 554, 564–566, 570, 645, 687, 708, 649, 678; 359/142, 146; 455/158.4, 158.5; H04N 5/445, 5/57

[56] References Cited

U.S. PATENT DOCUMENTS

| | | |
|---|---|---|
| 4,270,145 | 5/1981 | Farina ..................................... 348/570 |
| 4,451,840 | 5/1984 | Shanley, II .............................. 348/569 |
| 4,626,892 | 12/1986 | Nortrup et al. ......................... 348/569 |
| 4,837,627 | 6/1989 | Mengel . |
| 4,965,557 | 10/1990 | Schepers et al. ....................... 348/734 |
| 4,970,683 | 11/1990 | Harshaw et al. ........................ 395/156 |
| 5,005,084 | 4/1991 | Skinner ................................... 348/734 |
| 5,033,085 | 7/1991 | Rew . |
| 5,038,401 | 8/1991 | Inotsume ................................. 348/734 |
| 5,212,553 | 5/1993 | Maruoka ................................. 348/563 |
| 5,227,881 | 7/1993 | Wass et al. ............................. 348/734 |
| 5,228,122 | 7/1993 | Cahn et al. ............................. 395/156 |
| 5,237,417 | 8/1993 | Hagashi et al. ......................... 348/569 |
| 5,285,285 | 2/1994 | Yamada et al. ......................... 348/570 |
| 5,434,626 | 7/1995 | Hayashi et al. ......................... 348/569 |

FOREIGN PATENT DOCUMENTS

| | | |
|---|---|---|
| 1295730C | 2/1992 | Canada . |
| 4157991 | 5/1992 | Japan ............................. H04N 5/445 |
| 5075946 | 3/1993 | Japan ............................. H04N 5/445 |

*Primary Examiner*—Glenton B. Burgess

[57] ABSTRACT

An audio/visual apparatus which is made in such a constitution that the video or audio parameters which usually do not require frequent readjustment by users are, once adjusted and set, fixed and excluded from the parameter setting cycle. This operation of excluding parameters is carried out through remote control operation by means of a remote controller. Parameters to be excluded from the setting cycle are freely selected by users. Excluded parameters can be restored to the setting cycle through users' operation.

11 Claims, 9 Drawing Sheets

FIG. 4

```
┌─────────────────────────────────────────────┐
│                                             │
│     ┌───────────────────────────┐           │
│     │   CUSTOMIZE VIEWING       │           │
│     └───────────────────────────┘           │
│                                             │
│        Rename the inputs                    │
│                                             │
│        Name the channels                    │
│                                             │
│   ⇨   Lock A/V functions                    │
│                                             │
│                                             │
│                                             │
│                                             │
│     Use these buttons on the remote:        │
│                                             │
│   ⎛+⎞  ADJUST      ⊂⊃ENTER    ⊂⊃MENU        │
│   ⎝−⎠  to select     to enter    to exit    │
│                                             │
└─────────────────────────────────────────────┘
```

FIG. 6

```
┌─────────────────────────────────────────────────┐
│                                                 │
│        ┌─────────────────────────┐              │
│        │  LOCK A/V FUNCTIONS     │              │
│        └─────────────────────────┘              │
│                                                 │
│           NR  :  ON          (locked)           │
│                                                 │
│     You can lock some A/V functions to          │
│     their current settings. When you do         │
│     this, the function will not be              │
│     displayed until it is unlocked.             │
│                                                 │
│                                                 │
│     Use these buttons on the remote:            │
│                                                 │
│    ⊕ AUDIO or VIDEO   ⊕ ADJUST to lock          │
│    ⊖ to select        ⊖                         │
│      a menu item                                │
│    ⊂⊃ MENU to exit                              │
│                                                 │
└─────────────────────────────────────────────────┘
```

AUDIO/VISUAL APPARATUS FOR CONTROLLING CONTROL PARAMETERS

This application is a continuation, of application Ser. No. 08/518,568 filed on Aug. 23, 1995, now abandoned; which was a continuation application of Ser. No. 08/243,770, filed on May 17, 1994; now abandoned.

BACKGROUND OF THE INVENTION

1. Field of the invention

The present invention relates to an audio/visual apparatus such as color television receiver, and particularly to improvements in the ease of operation thereof.

2. Description of Related Art

As the color television receivers acquire higher video quality and advanced control functions in recent years, the number of video and audio parameters to be selected and set have been greatly increasing. A high-grade color television receiver has such parameters as shown below. Video parameters: hue, contrast, black level, sharpness, noise reduction (ON, OFF), color temperature (high, medium, low), color reproducibility (high fidelity, normal, flesh color enhancement) Audio parameters: mode selection (stereo, monaural, 2nd audio program), bass sound level, treble sound level, bass enhancement, right-left balance, surround effect (ON, OFF), speaker selection (internal, external), audio monitor output level (fixed, variable)

These numerous parameters may be adjusted and set by operating a remote controller which is equipped with a forward select button and a backward select button for the video parameters and a forward select button and a backward select button for the audio parameters.

Now the procedure of adjusting and setting the sharpness among the video parameters will be described below, with reference to FIG. 1 illustrative of the video parameter setting cycle of a color television receiver before shipment from the factory. First, when the forward select button for the video parameters is pressed, a video parameter screen which is determined by a program of a micro computer of the color television receiver is displayed. In the example shown in FIG. 1, a hue (TINT) screen is displayed. As it is desired to adjust and set the sharpness, the forward select button is further pressed until a sharpness (SHARP) screen is displayed after pressing the button four times. By pressing +button or –button of the remote controller when this screen is displayed, a bar graph G on the screen changes allowing to adjust and set the sharpness to a desired level.

Because color television receivers, particularly high-grade color television receivers today have a number of parameters to adjust and set for both video and audio functions as described above, to adjust and set a particular parameter requires a very troublesome operation of pressing the forward select button or the backward select button for the video or audio parameters many times. It is also true that the parameters include some parameters which are not usually adjusted and set by users.

SUMMARY OF THE INVENTION

One object of the invention is to provide an audio/visual apparatus and a remote controller for the control thereof which enable it to quickly adjust and set the video or audio parameters.

Another object of the invention is to provide an audio/visual apparatus and a remote controller for the control thereof which are capable of eliminating users' trouble in the operations to adjust and set the video or audio parameters.

Further another object of the invention is to provide an audio/visual apparatus and a remote controller for the control thereof which are capable of preventing the possibility of mistakes in the operations of adjusting and setting the video or audio parameters.

The audio/visual apparatus of this invention is made in such a constitution that the video or audio parameters which usually do not require readjustment by users are, once they are adjusted and set, fixed and excluded from the parameter setting cycle. Parameters to be fixed and excluded from the setting cycle can be freely selected by users. As a result, the parameter setting cycle includes only such parameters that are adjusted and set frequently by users, thereby to allow adjusting and setting the desired parameters more quickly. Also, mistakes in adjustment and setting of parameters which are not usually handled due to mis-operation are prevented.

When excluding a particular parameter from the setting cycle or when restoring it, state of the parameter setting is displayed on the screen. When reset operation is carried out to reset all parameters to the levels in factory shipment, those parameters which have been excluded from the setting cycle may be either restored to the setting cycle or made to remain out of the setting cycle, although their levels are reset.

The above and further objects and features of the invention will more fully be apparent from the following detailed description with accompanying drawings.

BRIEF DESCRIPTION OF THE DRAWINGS

FIG. 4 is a drawing illustrative of an example of a screen displayed in the audio/visual apparatus of the invention.

FIG. 6 is a drawing illustrative of an example of a screen displayed in the audio/visual apparatus of the invention.

DESCRIPTION OF THE PREFERRED EMBODIMENTS

The invention will now be described in detail below with reference to the accompanying drawings illustrative of the preferred embodiments.

Figure 2:
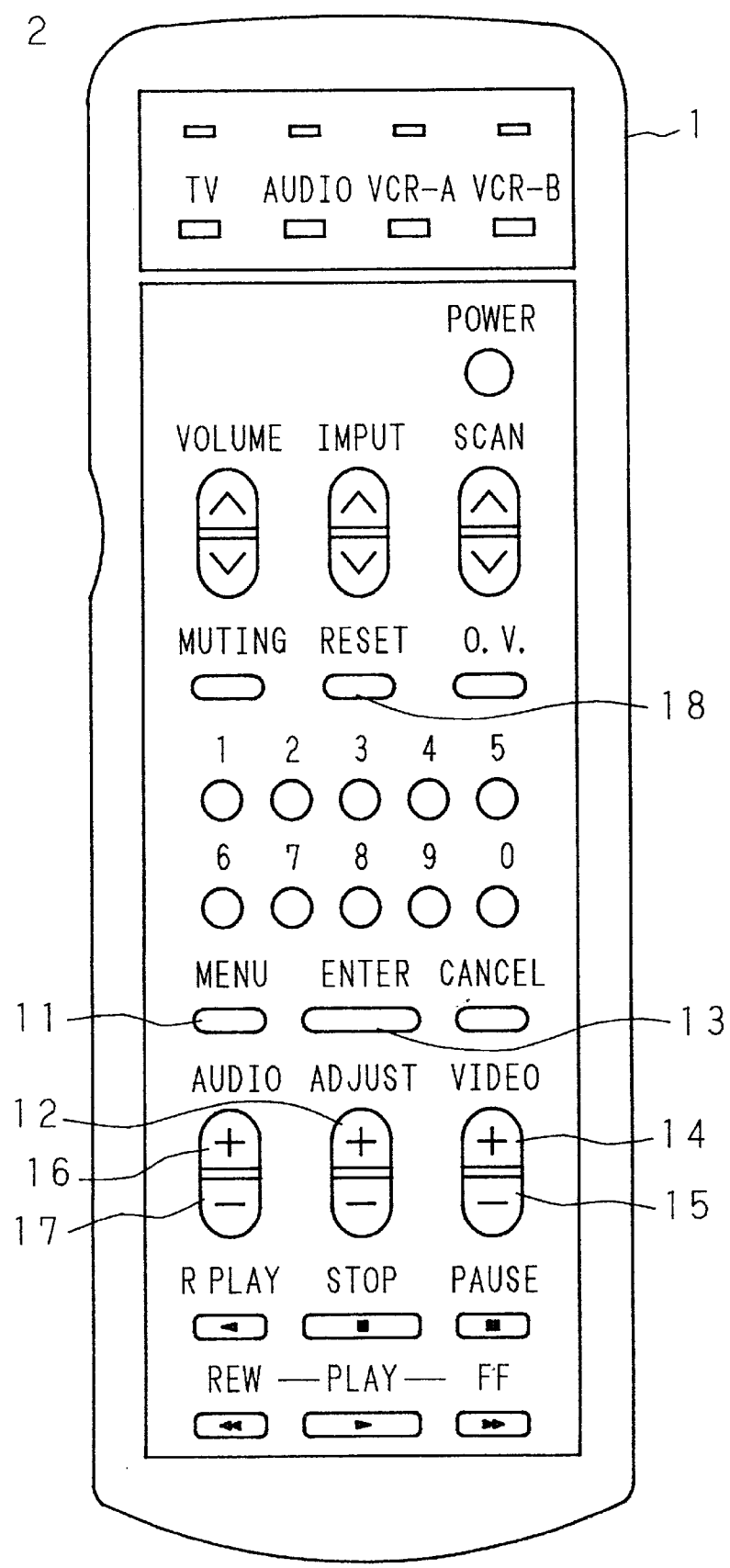
FIG. 2 is a plan view drawing of a remote controller of the invention.

FIG. 2 is a plan view of a remote controller of the invention. The remote controller 1 is used to remotely control a color television receiver and a video cassette recorder. The remote controller 1 is provided with, in addition to a power button, a volume control button and a channel selector button, a menu button 11 to display a menu screen, an ADJUST button 12 to select a desired setting from the displayed menu, an ENTER button 13 to determine the setting which has been selected, a forward select button 14 and a backward select button 15 to display the video parameters, a forward select button 16 and a backward select button 17 to display the audio parameters, a reset button 18 to reset all the video and audio parameters to the original levels which are set in the factory, etc.

The operation of excluding particular video or audio parameters from the setting cycle (FIG. 1) prepared at the time of shipment from the factory according to the invention will first be described, with reference to the screens displayed on the color television receiver as shown in FIG. 3 through FIG. 6.

Figure 3:
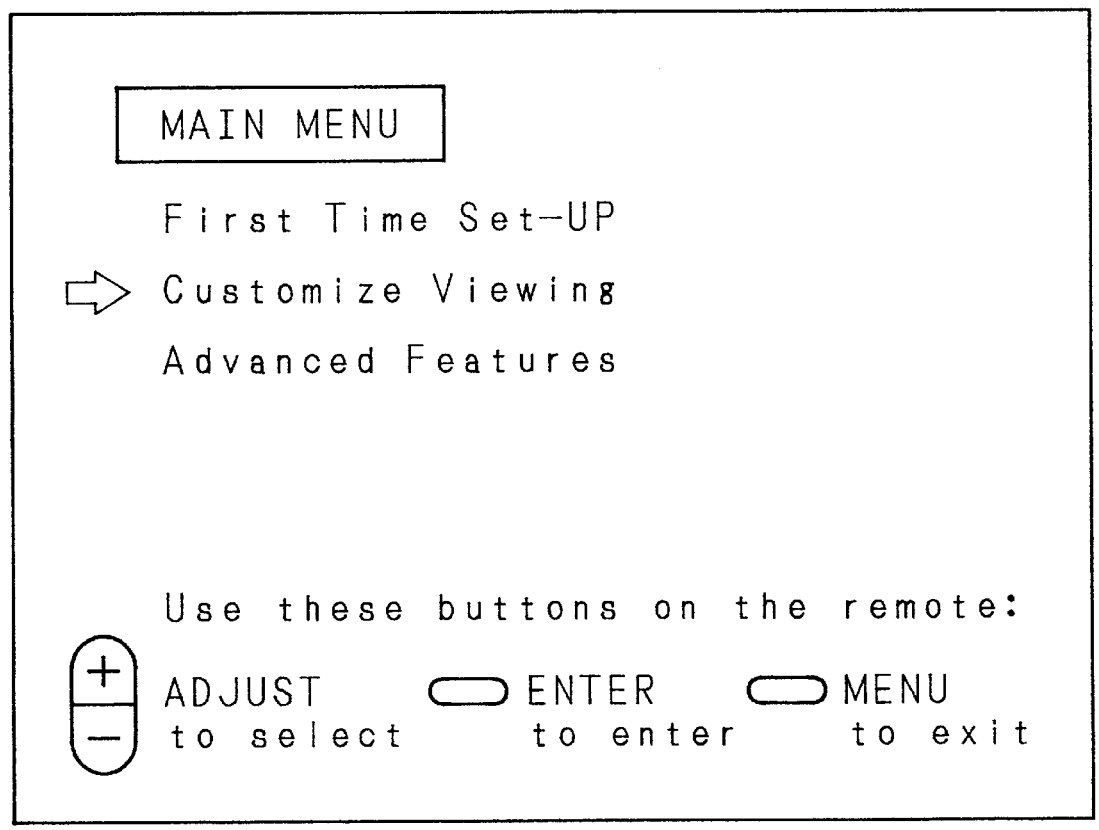
FIG. 3 is a drawing illustrative of an example of a screen displayed in the audio/visual apparatus of the invention.

When the menu button 11 of the remote controller 1 as shown in FIG. 2 is pressed, MAIN MENU screen shown in FIG. 3 appears. The screen is changed to CUSTOMIZE VIEWING sub-menu shown in FIG. 4 by selecting the second item "Customize Viewing" from the menu by means of the + or − ADJUST button 12 of the remote controller 1 under the direction given at the bottom of the screen, then pressing the ENTER button 13 of the remote controller 1. The screen is further changed to LOCK A/V FUNCTIONS sub-menu shown in FIG. 5 by selecting the third item "Lock A/V functions" by means of the ADJUST button 12, then pressing the ENTER button 13. On this screen, some video and audio parameters are fixed to the levels which are set at the time, and are excluded from the setting cycle (FIG. 1) prepared in the factory.

Figure 5:
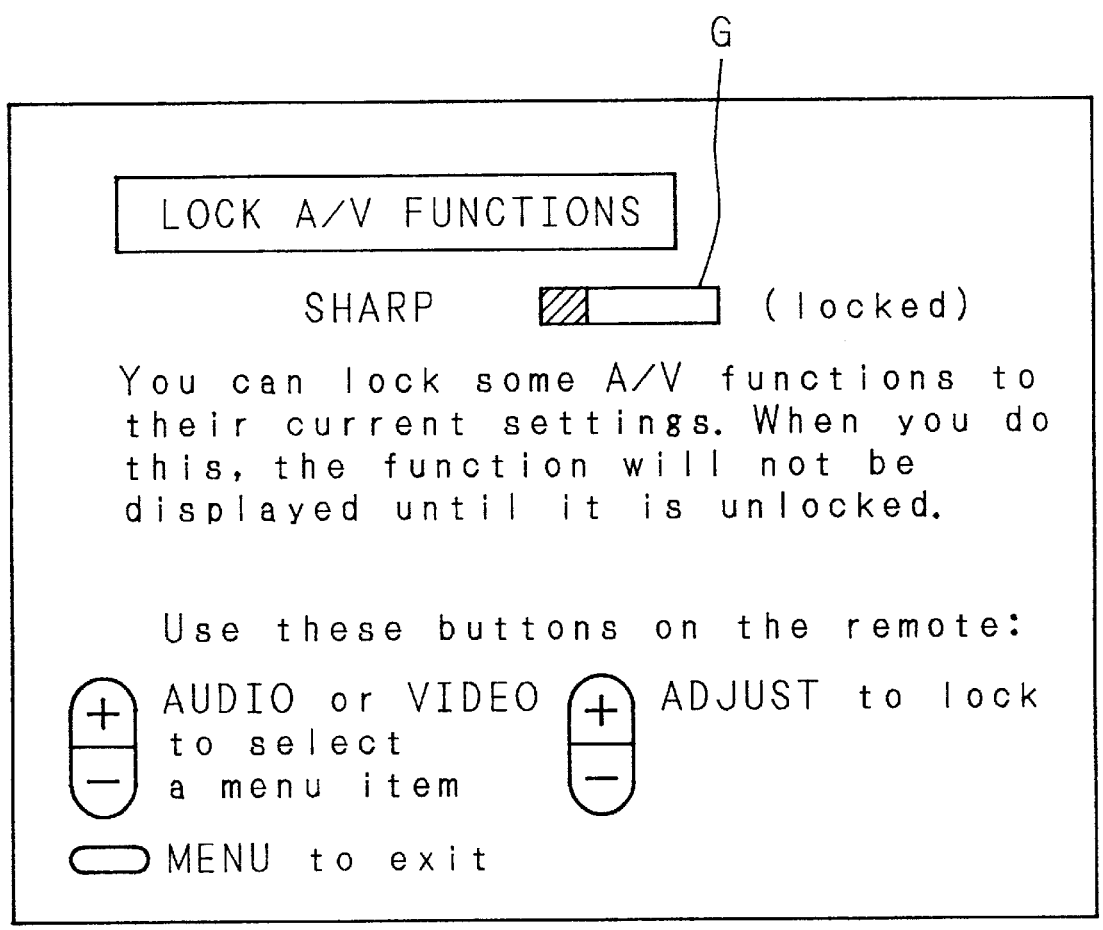
FIG. 5 is a drawing illustrative of an example of a screen displayed in the audio/visual apparatus of the invention.

Now the operations will be described taking specific examples. In order to fix the setting of sharpness (SHARP) which is one of the video parameters and then exclude the video parameter of sharpness from the setting cycle, for example, the forward select button 14 for the video parameters of the remote controller 1 is pressed for the required number of times to have SHARP displayed as the selected parameter at the top of the screen as shown in FIG. 5. Now the level which is set at the time is displayed by the bar graph G. In order to fix the sharpness to this level, the ADJUST button 12 of the remote controller 1 is pressed to change the display from "unlocked", which has been set in the factory, to "locked". This operation fixes the sharpness to this level and excludes it from the setting cycle of the video parameters.

In order to fix the setting of noise reduction (VIDEO NR) to ON or OFF and then exclude this video parameter from the setting cycle, the forward select button 14 for the video parameters is pressed similarly to the case of sharpness, thereby to have NR displayed as the selected parameter at the top of the screen as shown in FIG. 6. The level of setting in this case is not shown by the bar graph, but shown in letters of ON or OFF. Thus changing the setting from the original level of "unlocked" in factory shipment to "locked" by means of the ADJUST button 12 makes noise reduction fixed to ON and excluded from the setting cycle of the video parameters.

Figure 7:
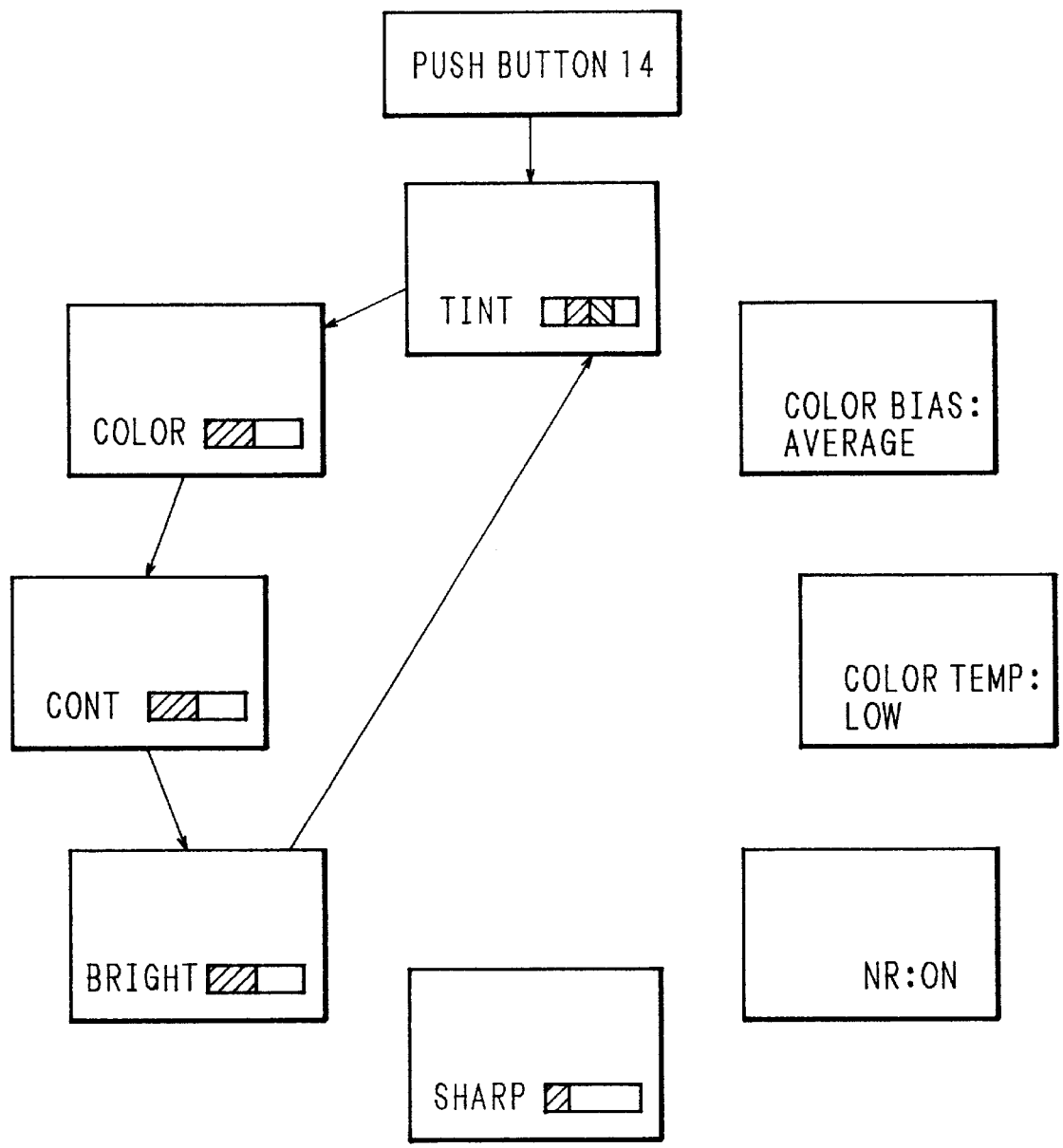
FIG. 7 is a drawing illustrative of a video parameter setting cycle after particular parameters are excluded in the audio/visual apparatus of the invention.

By repeating such operations as described above, all parameters which are not usually handled by users can be excluded from the setting cycle. FIG. 7 shows an example of the setting cycle wherein sharpness (SHARP), noise reduction (NR), color temperature (COLOR TEMP) and color reproducibility (COLOR BIAS) are set to fit users's taste and then these video parameters are excluded from the setting cycle.

Figure 8:
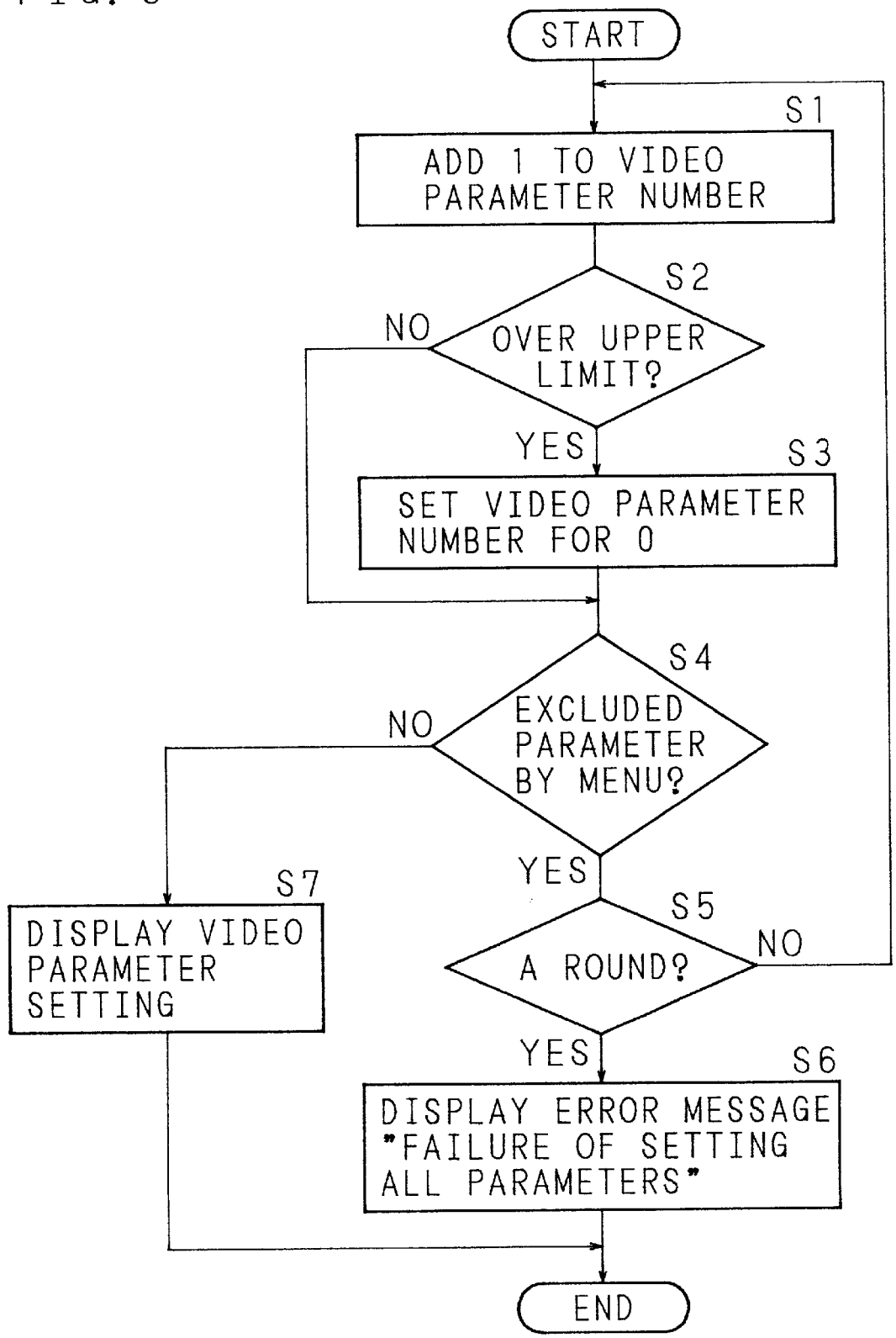
FIG. 8 is a flow chart of operations in the audio/visual apparatus of the invention.

Operation of pressing the forward select button 14 for video parameters, identifying the parameter to judge whether it is excluded or not excluded, and adjusting and setting the video parameter will be described below with reference to the flow chart of FIG. 8. First, the video parameter number is incremented by 1 (step S1) and the result of increment is checked to see if it exceeds a specified upper limit or not (step S2). If it exceeds the upper limit, the video parameter number is reset to 0 (step S3) and the operation proceeds to step S4. If not, the operation proceeds directly to step S4. Then the video parameter corresponding to the number is checked to see if it is excluded by MENU or not (step S4). If it is an excluded parameter, it is checked whether one round of the setting cycle has been completed or not (step S5). If completed, the operation is completed with a message "failure of setting all parameters" being displayed (step S6). If one round has not been completed, the operation returns to step S1. If the parameter is found by the check in step S4 to have not been excluded, the video parameter is displayed to allow setting (step s7) and the operation is completed.

Now the operation of restoring a parameter which has once been excluded from the setting cycle, after fixing the level thereof, will be described below. This restoring operation can be done individually for each parameter by operating on the LOCK A/V FUNCTIONS screen (refer to FIGS. 5, 6). However, all parameters can be returned to the original in factory shipment at the same time by pressing the reset button 18 of the remote controller 1 and using a reset function which resets all the video and audio parameters simultaneously to the original levels. In this case, those parameters which have been excluded from the setting cycle may be either restored to the setting cycle or made to remain out of the setting cycle. Also such a reset function may be provided in the television receiver.

Figure 9:
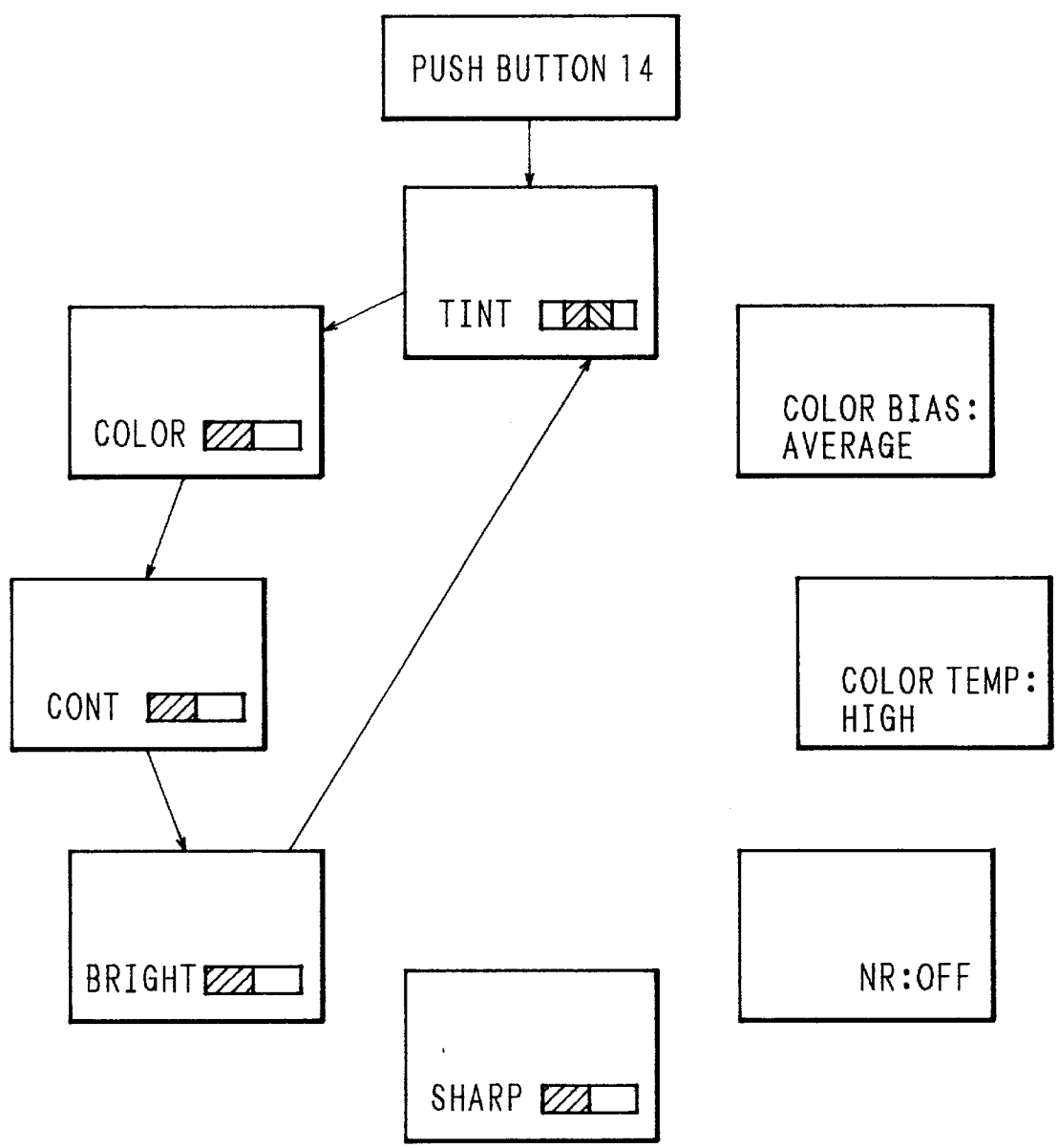
FIG. 9 is a drawing illustrative of a video parameter setting cycle after the levels of all parameters are reset.

FIG. 9 shows an example of making excluded parameters remain excluded when actuating the reset function. Levels of the video parameters (sharpness, noise reduction, etc.) which have been excluded from the setting cycle are reset to the levels in factory shipment, although they are still excluded from the setting cycle. Although it is not necessary to exclude the parameters which are not usually handled once again after resetting, it is necessary to adjust and fix the levels after them to the setting cycle in case their levels are to be changed.

Figure 1:
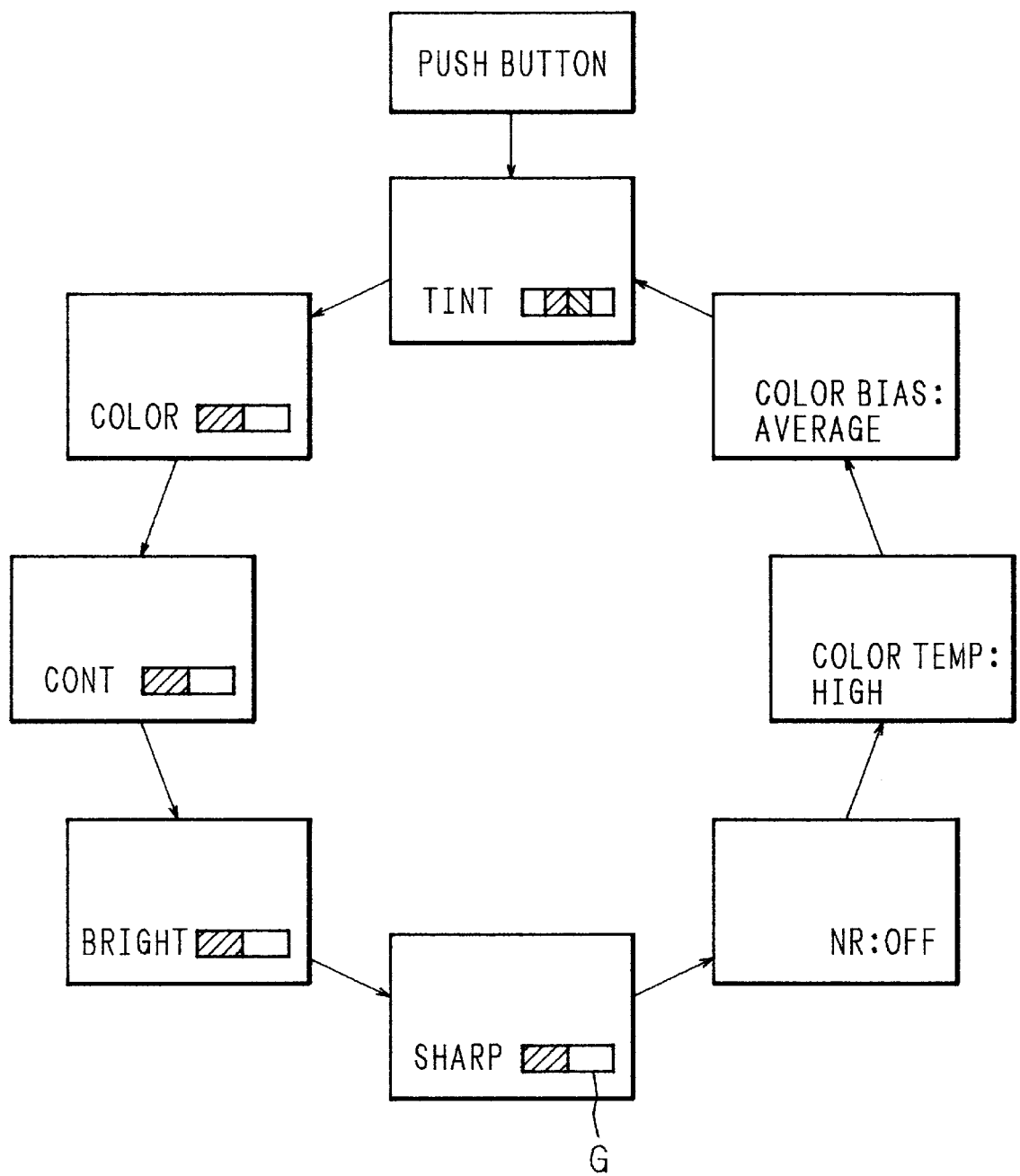
FIG. 1 is a drawing illustrative of a video parameter setting cycle at the time of shipment from the factory.

On the other hand, in case parameters which have been excluded from the setting cycle when the reset function was actuated are restored, the setting cycle after actuating the reset function returns to the state shown in FIG. 1. In this case, although changing of the set levels is easy, it is necessary to carry out the operation of excluding the parameters which are not usually handled from the setting cycle once again.

As described above, according to the invention, levels of parameters which are not usually handled by users among a number of video and audio parameters can be fixed and thereafter excluded from the setting cycle in an audio/visual apparatus such as color television receiver. As a result, levels of parameters which are adjusted by users relatively frequently can be set more quickly. Also there is no possibility of erroneously setting the levels of parameters which are not usually handled by users.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An audio/visual apparatus, comprising:

a plurality of control parameters including at least one of a set of video parameters including sharpness and contrast, and a set of audio parameters including bias sound level and high-pitched sound level, said plurality of control parameters being sequentially selected and adjusted in a setting cycle;

a selecting unit which selects plural control parameters from among said plurality of control parameters, to be excluded from said setting cycle;

an excluding unit which excludes said plural control parameters selected by said selecting means from said setting cycle; and a restoring unit which restores all of said plural control parameters excluded by said excluding means back into said setting cycle in response to a single actuation of a restore switch.

2. The audio/visual apparatus of claim 1, further comprising:

a display unit which displays a state of a parameter setting of a particular parameter, when excluding said plural control parameters from said setting cycle and/or when restoring said plural control parameters excluded by said excluding unit to said setting cycle.

3. The audio/visual apparatus of claim 1, further comprising:

a resetting unit which resets all of said plurality of control parameters to factory selected default levels when restoring said plural control parameters excluded by said excluding unit to said setting cycle.

4. An audio/visual apparatus having a plurality of control parameters displayed on a television screen, wherein said plurality of control parameters may be sequentially selected and adjusted in a setting cycle, comprising:

selecting means for selecting at least one of said control parameters from among said plurality of control parameters, adjustable at least within a single television channel, to be excluded from said setting cycle;

excluding means for excluding said at least one of the control parameters selected by said selecting means from said setting cycle;

resetting means for resetting the adjusted control level of all of said selected control parameters excluded from said setting cycle by said excluding means to factory selected default levels in response to a single actuation of a reset switch.

5. An audio/visual apparatus having a plurality of control parameters displayed on a television screen, wherein said plurality of control parameters may be sequentially selected and adjusted in a setting cycle by a remote controller, comprising:

selecting means for selecting at least one of the control parameters in response to operation of said remote controller from among said plurality of control parameters to be excluded from said setting cycle;

adjusting means for adjusting said at least one of the control parameters selected by said selecting means in response to operation of said remote controller selected by said selecting means; and excluding means for excluding said at least one of the control parameters selected by said selecting means from said setting cycle in response to operation of said remote controller, said excluding means prohibiting an adjusted level of said at least one of the control parameters from being further adjusted by said adjusting means.

6. A remote controller for adjusting a plurality of control parameters displayed on a television screen, wherein said plurality of control parameters may be sequentially selected and adjusted in a setting cycle, comprising:

selecting means for selecting at least one of the control parameters from among said plurality of control parameters to be excluded from said setting cycle;

adjusting means for adjusting said at least one of the control parameters selected by said selecting means;

excluding means for excluding said at least one of the control parameters after adjustment of the control parameters from the setting cycle by said adjusting means;

restoring means responsive to a single actuation of a restore switch for restoring all of said excluded control parameters excluded by said excluding means back into said setting cycle.

7. A remote controller of claim 6, wherein said selecting means has first shifting means for forward selection in the setting cycle and second shifting means for backward selection in the setting cycle.

8. A remote controller of claim 6, further comprising:

resetting means for resetting all the control parameters to the levels in factory shipment.

9. A remote controller of claim 8, wherein when said resetting means is actuated, said at least one of the control parameters excluded from said setting cycle is restored back into said setting cycle.

10. The remote controller of claim 8, wherein when said resetting means is actuated, said at least one of the control parameters excluded from said setting cycle are maintained to be excluded from said setting cycle.

11. The audio/visual apparatus of claim 4, further comprising:

display means for displaying a state of a parameter setting of a particular parameter, when excluding the control parameter from said setting cycle and/or when restoring the control parameter back into said setting cycle.

* * * * *

UNITED STATES PATENT AND TRADEMARK OFFICE
CERTIFICATE OF CORRECTION

PATENT NO. : 5,774,187
DATED : 6/30/98
INVENTOR(S) : TSUNODA

It is certified that error appears in the above-identified patent and that said Letters Patent is hereby corrected as shown below:

Column 5, line 5, change "bias" to --bass--.

Signed and Sealed this

Thirteenth Day of April, 1999

Attest:

Q. TODD DICKINSON

*Attesting Officer*         *Acting Commissioner of Patents and Trademarks*